US009524069B2

(12) United States Patent
Luo (10) Patent No.: US 9,524,069 B2
(45) Date of Patent: Dec. 20, 2016

(54) KEYPAD WITH 1-BIT CAPACITIVE TOUCH SENSING ANALOG FRONT END WITH SPARSE MULTI-TOUCH DETECTION

(71) Applicant: Texas Instruments Incorporated, Dallas, TX (US)

(72) Inventor: Chenchi Luo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 112 days.

(21) Appl. No.: 14/631,837

(22) Filed: Feb. 25, 2015

(65) Prior Publication Data

US 2016/0246407 A1 Aug. 25, 2016

(51) Int. Cl.
*G06F 3/044* (2006.01)

(52) U.S. Cl.
CPC .................... *G06F 3/044* (2013.01)

(58) Field of Classification Search
CPC ..................... G06F 3/044; G06F 2203/04104
USPC .................................. 345/173, 174
See application file for complete search history.

(56) References Cited

U.S. PATENT DOCUMENTS

| 8,692,801 | B2 | 4/2014 | Luo et al. | |
|---|---|---|---|---|
| 2011/0234528 | A1* | 9/2011 | Guedon | G06F 3/0416 345/174 |
| 2013/0257783 | A1* | 10/2013 | Luo | G06F 3/044 345/174 |

OTHER PUBLICATIONS

Quantized Iterative Hard Thresholding: Bridging 1-bit and High-Resolution Quantized Compressed Sensing, by Laurent Jacques, Kevin DeGrauz and Christoph De Cleeschouwer, ICTEAM Institute, ELEN Department, Universite catholique de Louvain (UCL), May 9, 2013.*
Chenchi (Eric) Luo, "A Low Power Self-capacitive Touch Sensing Analog Front End with Sparse Multi-touch Detection", 2014 IEEE International Conference on Acoustic, Speech and Signal Processing (ICASSP), May 4-9, 2014, Florence, Italy, pp. 3007-3011.
Emmanuel J. Candes and Terence Tao, "Near-Optimal Signal Recovery From Random Projections: Universal Encoding Strategies?", IEEE Transactions on Information Theory, vol. 52, No. 12, Dec. 2006, pp. 5406-5425.
T. Blumensath, M. Yaghoobi and M. E. Davies, "Iterative Hard Thresholding And L0 Regularisation", 2007 IEEE International Conference on Acoustics, Speech and Signal Processing (ICASSP), vol. 3, Apr. 15-20, 2007, Honolulu, Hawaii, pp. 877-880.

(Continued)

*Primary Examiner* — Ilana Spar
*Assistant Examiner* — Jeffrey S Steinberg
(74) *Attorney, Agent, or Firm* — Ronald O. Neerings; Frank D. Cimino (57) ABSTRACT

A capacitive touch keypad may receive a touch by a conductive object to one or more keys of the keypad, in which the keys each have a separate capacitive key electrode. The touched locations may be determined by precharging a pseudo-randomly selected set of key electrodes a number (M) of iterations while the keyboard is being touched, producing a sense voltage for each iteration by coupling all of the key electrodes to a reference capacitor, producing a 1-bit sense measurement for each iteration by comparing the sense voltage to a reference voltage to form a set of M 1-bit sense measurement, and by applying a modified binary iterative hard threshold (BIHT) algorithm to the set of M 1-bit sense measurements, in which only the non-zero locations of the solution are monitored in each iteration.

20 Claims, 8 Drawing Sheets

(56) References Cited

OTHER PUBLICATIONS

Chenchi (Eric) Luo et al, "Sparse Touch Sensing For Capacitive Touch Screens", 2012 IEEE International Conference on Acoustics, Speech and Signal Processing (ICASSP), Mar. 25-30, 2012, Kyoto, Japan, pp. 2545-2548.
Chenchi Luo et al, "Compressive Sensing for Sparse Touch Detection on Capacitive Touch Screens", IEEE Journal on Emerging and Selected Topics in Circuits and Systems, vol. 2, No. 3, Sep. 2012, pp. 639-648.
Petros T. Boufounos and Richard G. Baraniuk, "1-Bit Compressive Sensing", CISS 2008, 42nd Annual Conference on Information Sciences and Systems, 2008, Mar. 19-21, 2008, Princeton, NJ, pp. 16-21.
Laurent Jacques et al, "Robust 1-Bit Compressive Sensing via Binary Stable Embeddings of Sparse Vectors", IEEE Transactions on Information Theory, vol. 59, No. 4, Apr. 2013, pp. 2082-2102.

\* cited by examiner

KEYPAD WITH 1-BIT CAPACITIVE TOUCH SENSING ANALOG FRONT END WITH SPARSE MULTI-TOUCH DETECTION

FIELD OF THE DISCLOSURE

This disclosure generally relates to capacitive touch sensing keypads, and in particular to self-capacitance sensing.

BACKGROUND OF THE DISCLOSURE

The capacitive sensing technology has been in use for decades. However, the launch of the iPhone in 2007 initiated an explosive wave of deployment of the capacitive sensing technology. Many of today's smart phones are equipped with a capacitive touch screen. There is an increasing demand for capacitive touch screens with larger sizes and quicker response that tends to result in higher complexity and power consumption in the analog front end design. However, the number of simultaneous touches supported remains relatively unchanged. For example, for a capacitive touch keyboard, typically no more than three key combinations are expected to be entered at the same time.

BRIEF DESCRIPTION OF THE DRAWINGS

Particular embodiments in accordance with the disclosure will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Capacitive sensing technology is ubiquitous in today's electronic devices. Embodiments of the disclosure may include an ultra low power capacitive touch sensing analog front end (AFE) that exploits the sparsity of simultaneous touches with respect to the number of sensor nodes. It is possible to significantly reduce the complexity and the power consumption of the AFE by migrating the computational burden to a digital processor that is used by a system for other functions which usually has surplus computational power. The analog to digital converters (ADC(s)) in a conventional touch screen AFEs may be replaced by a single comparator. The number of measurements required in order to resolve the touch positions is related to the number of simultaneous touches rather than the number of sensor nodes, as will be described in more detail below.

While there is an increasing demand for capacitive touch screens with larger sizes and quicker responses, the number of simultaneous touches supported typically remains relatively unchanged. For example, for a capacitive touch keyboard, no more than three key combinations are expected to be entered at the same time. For a phone size screen, one can hardly fit 4 fingers on it. In other words, the ratio between the active touches with regard to the total number of touch sensors is small. The theory of Compressive Sensing (CS) may be applied to this application. CS suggests that the number of measurements required to resolve such a sparse signal is approximately proportional to the sparsity of the signal. See, e.g., E. J. Candes and T. Tao, "Near-optimal signal recovery from random projections: Universal encoding strategies?," Information Theory, IEEE Transactions on, vol. 52, no. 12, pp. 5406-5425, December 2006, which is incorporated by reference herein. However, for touch screens, a complete reconstruction of a touch is not necessary since typically only the locations of the touches are of interest, rather than its magnitude. This leads to a further simplification of the AFE design, as will be described in more detail below.

Capacitance Sensing by Charge Transfer

In electrical circuits, the term capacitance usually refers to the mutual capacitance between two adjacent conductors, such as the two parallel plates of a capacitor. There also exists a property called self capacitance, which is the amount of electrical charge injected onto an isolated conductor to raise its electrical potential by one volt. Theoretically, the reference point for this potential is a hollow conducting sphere of infinite radius, centered on the conductor. In practice, since the earth is a very large conductor and hence is considered to be at zero potential with regard to an isolated conductor, the other plate is considered to be the earth. In a self capacitance touch screen, the electrodes can be patterned on a single layer or two layers. Each electrode represents a unique touch coordinate and is connected individually to a controller.

Figure 1:
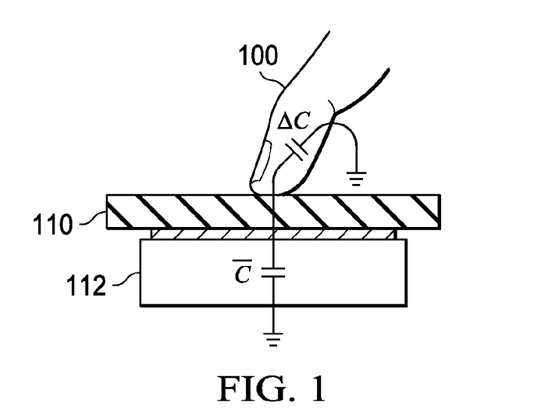
FIG. 1 illustrates a finger touching a capacitive keypad surface.

FIG. 1 illustrates a finger 100 touching a capacitive keypad surface 110. As shown in FIG. 1, when a finger or a conductive stylus is close to a keypad electrode 112, the human body capacitance ΔC is added in parallel with the parasitic or background capacitance C of the electrode 112. A touch may be located by sensing the small change in capacitance at that electrode. When the electrodes are laid over two layers, they can be arranged in a layer of columns and a layer of rows such that the (X; Y) coordinate of a touch is determined separately for the row and column.

Figure 2A:
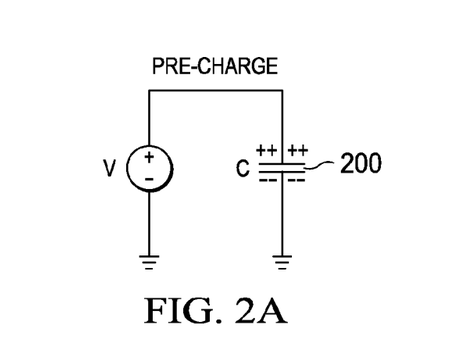
FIGS. 2A-2B illustrate charge transfer caused by a touch.
Figure 2B:
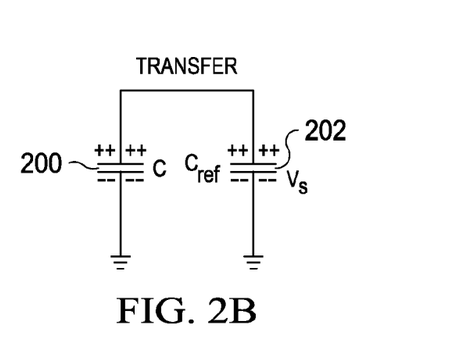

FIGS. 2A-2B illustrate charge transfer caused by a touch. An accurate and fast capacitance sensing technique lies at the heart of a capacitive touch screen. Also known as "QT" (charge-time) sensors, charge transfer capacitance sensors are extremely sensitive and are able to reach a differential resolution of sub-femto farads. In the pre-charge stage illustrated in FIG. 2A, the unknown capacitor C 200 is charged by a DC voltage source V so that in steady state, the charge accumulated over C is indicated by equation (1).

$$Q=VC \qquad (1)$$

In the transfer stage illustrated in FIG. 2B, a known reference capacitor Cref 202 is connected in parallel with C 200 such that a portion of the charge on C is transferred onto Cref. Denoting the potential over Cref as Vs, according to the conservation of total charge, the result is indicated by equation (2).

$$VC=Vs(C+Cref) \qquad (2)$$

Equation (2) can be rearranged as equation (3).

$$V_S = \frac{C}{C+C_{ref}} V \qquad (3)$$

If Cref>>C, equation (3) may be rewritten as equation (4).

$$V_S \approx \frac{C}{C_{ref}} V = \frac{1}{C_{ref}} Q \qquad (4)$$

Equation (4) enables the capacitance to be estimated using a proportional relationship between the drive and sense voltages.

Figure 3:
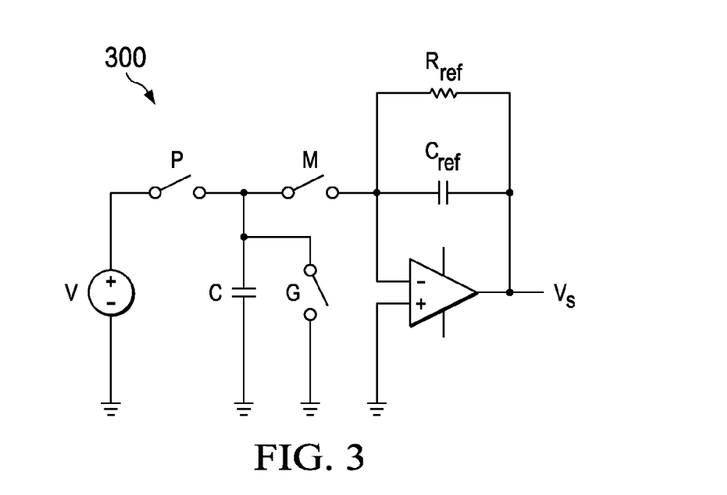
FIG. 3 is a schematic of practical circuit for a QT sensor.

FIG. 3 shows a practical circuit of a QT sensor 300. A resistor Rref is connected in parallel with Cref to reset Cref before the next measurement. Precharge switch P may be closed during the pre-charge stage while precharge grounding switch G is open, while sense measuring switch M is open. Alternatively, precharge grounding switch G may be closed while precharge switch P is open. During the measurement stage, measuring switch M is closed and precharge switches P and Q are open. Equation (5) illustrates one voltage sample.

$$V_S(t) = -V \frac{C}{C_{ref}} e^{\frac{-t}{\tau}} \qquad (5)$$

where $\tau = R_{ref}C_{ref}$. At the measurement instant $t=t_0 \ll \tau$, the resulting sense voltage is indicated by (6).

$$V_S(t_0) \approx -V \frac{C}{C_{ref}} = -\frac{1}{C_{ref}} Q \qquad (6)$$

which is exactly the same voltage as in (4) except for a polarity reversal.

1-Bit AFE Architecture

Figure 4:
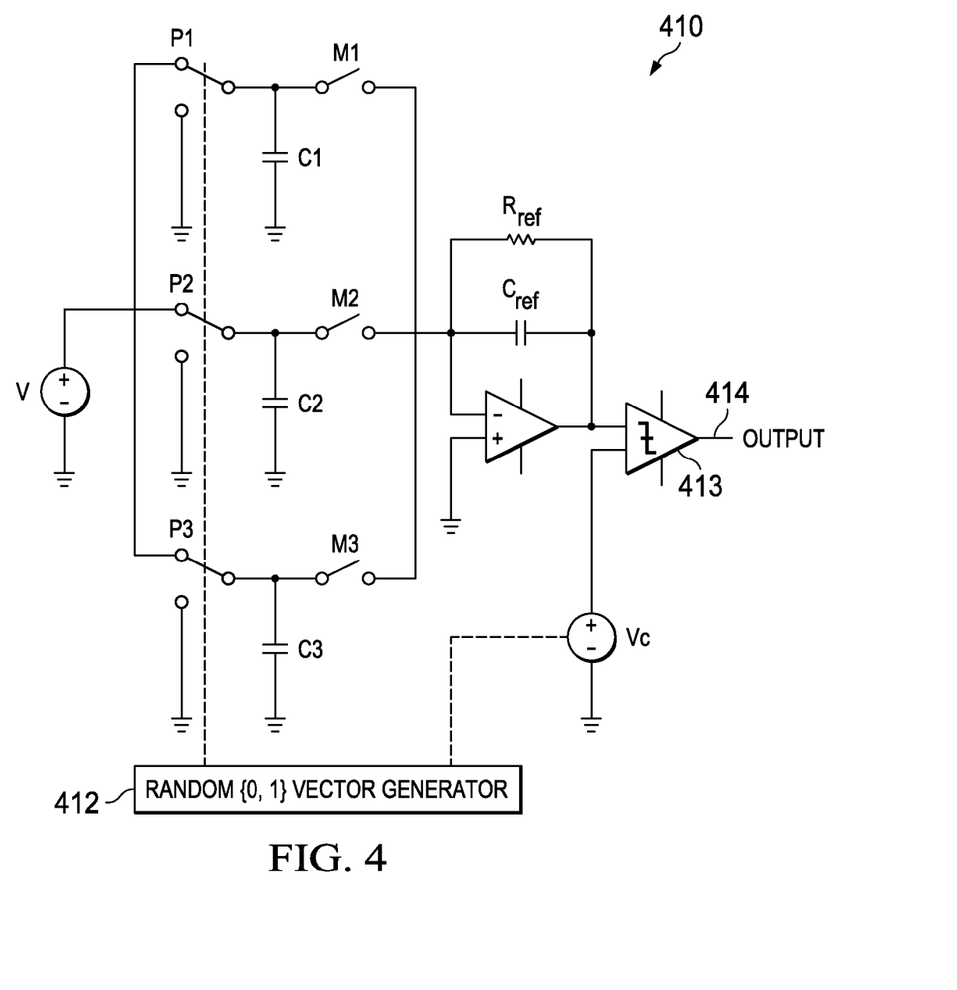
FIG. 4 illustrates an example analog front end for a 1-bit capacitance sensing architecture.

FIG. 4 illustrates an example schematic diagram of an analog front end (AFE) 410 for a 1-bit capacitance sensing architecture. Suppose there are N capacitance sensor nodes. Three nodes are illustrated in FIG. 4 for simplicity. The capacitance at the n-th (n=0, . . . , N-1) sensor is indicated by equation (7).

$$C_n = C_n^b + \Delta C_n \qquad (7)$$

where $C_n^b$ is the background capacitance and $\Delta C_n$ is the capacitance change introduced by a touch object.

Suppose M measurements are taken. For the m-th (m=0, . . . , M-1) measurement, in the pre-charge stage, a Bernoulli random number generator (RNG) 412 may be used to generate a vector of {0, 1} values to control the precharge switch P's to charge each capacitance sensor to voltage V or to discharge each capacitance sensor to ground, similar to switches P and G in FIG. 3. A Bernoulli RNG may generate random binary numbers with a specified probability of having a value of 0 or 1, for example. For this example, a probability of 0 may be selected to be 0.5. The charging voltage on capacitance sensor n may be denoted as $V_n^m$. When a specific key is being touched, if that key is not precharged during a measurement cycle, then no charge is transferred to the sense circuitry and that touch will therefore not contribute to the sense voltage for that measurement cycle. Conversely, if a touched key is precharged during a measurement cycle, then the $\Delta c$ provided by the conductive finger or stylus will also be charged which will then contribute to the sense voltage for that measurement cycle. In this manner, by applying a set of precharge patterns, the exact location of the touched key(s) may be deduced.

In the sensing stage, all switch P's are set to an open position and all switch M's are closed so that all the charge on the capacitance sensor will be transferred to the capacitance measurement circuit. The output of the circuit is given by equation (8), which represents a summation of the precharged sense elements for that measurement cycle, as indicated by (8).

$$V_s^m \approx -\frac{1}{C_{ref}} Q = \frac{-1}{C_{ref}} \sum_{n=0}^{N-1} C_n V_n^m \qquad (8)$$

The sensed voltage is then passed into a comparator 413 with a calibration voltage $V_c^m$, as indicated by (9). Since the background capacitance $C_n^b$ can be measured offline during a calibration phase, an exact knowledge of $V_c^m$ may be determined.

$$V_c^m = \frac{-1}{C_{ref}} \sum_{n=0}^{N-1} C_n^b V_n^m \qquad (9)$$

The final binary output 414 for each measurement cycle of the AFE passed to the digital processor is indicated by equation (10) and by (11) after substituting equations (7), (8), and (9). The sgn(x) function may return a value of 0 or 1 depending on the sign of the argument.

$$y^m = \text{sgn}(V_s^m - V_c^m) \qquad (10)$$

$$y^m = \text{sgn}\left(\frac{-1}{C_{ref}} \sum_{n=0}^{N-1} \Delta C_n V_n^m \right) \qquad (11)$$

Figure 5:
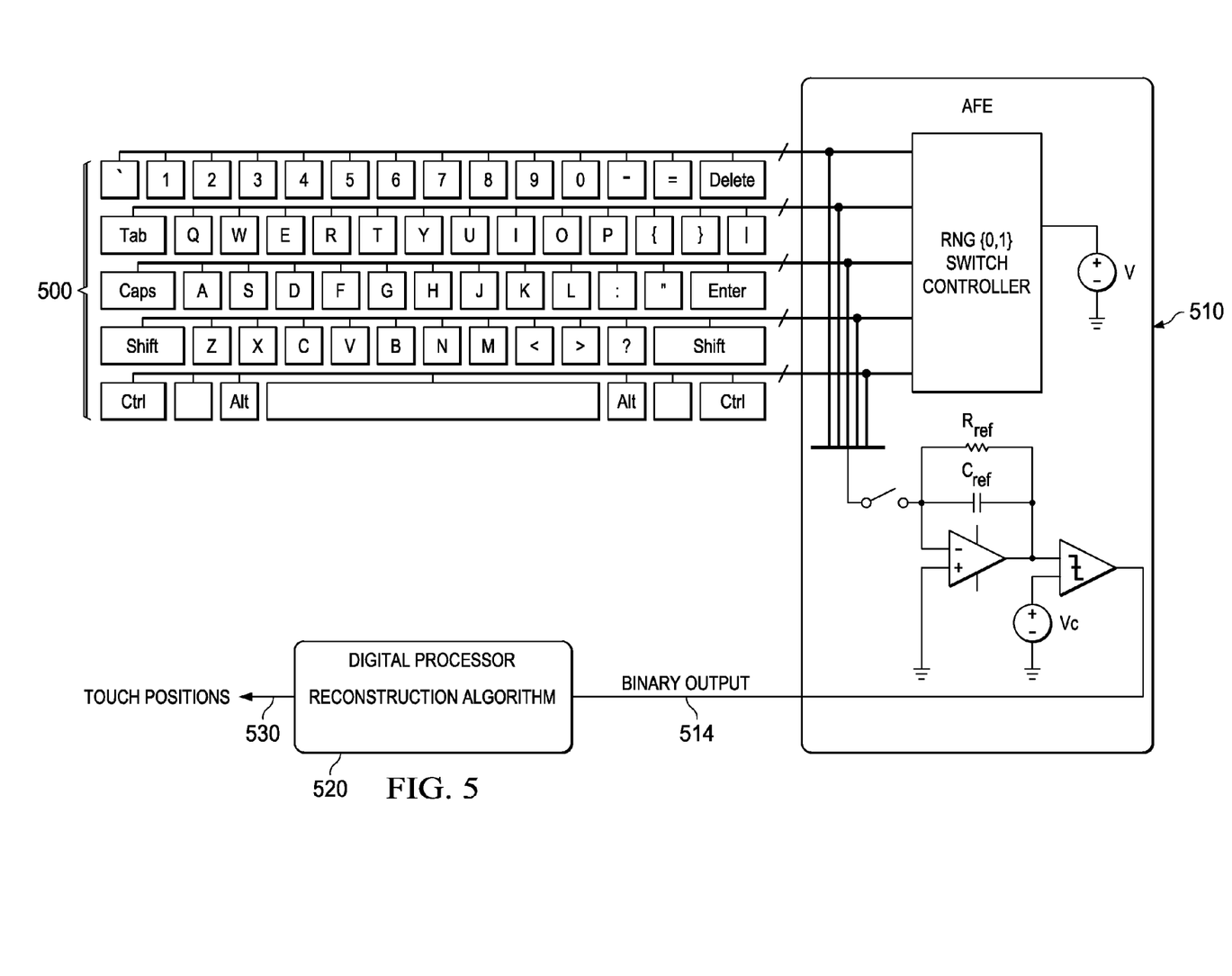
FIG. 5 illustrates an example of a 1-bit capacitance sensing keyboard.

FIG. 5 illustrates an example of a capacitance sensing keyboard 500 with a 1-bit AFE 510 that operates similarly to 1-bit AFE 410, as described above. During use, touches to the various keys may be detected by performing a series of measurements as described above to form a sequence of 1-bit outputs 514 that may then be sent to a digital processing module 520 to determine each touch position and output the determined touch positions 530 for use by an application program that is receiving input from the keyboard. Processor 520 may be the main processor for a system for example, or it may be one of several processors included within a system. Typically, the computational load generated during key position reconstruction may be performed using spare computational bandwidth of a system processor, for example. Typically, processor 520 may include instruction and data memory within a single integrated circuit (IC) package. In another embodiment, instruction and/or data memory may be located in separate IC packages, for example.

Figure 6:
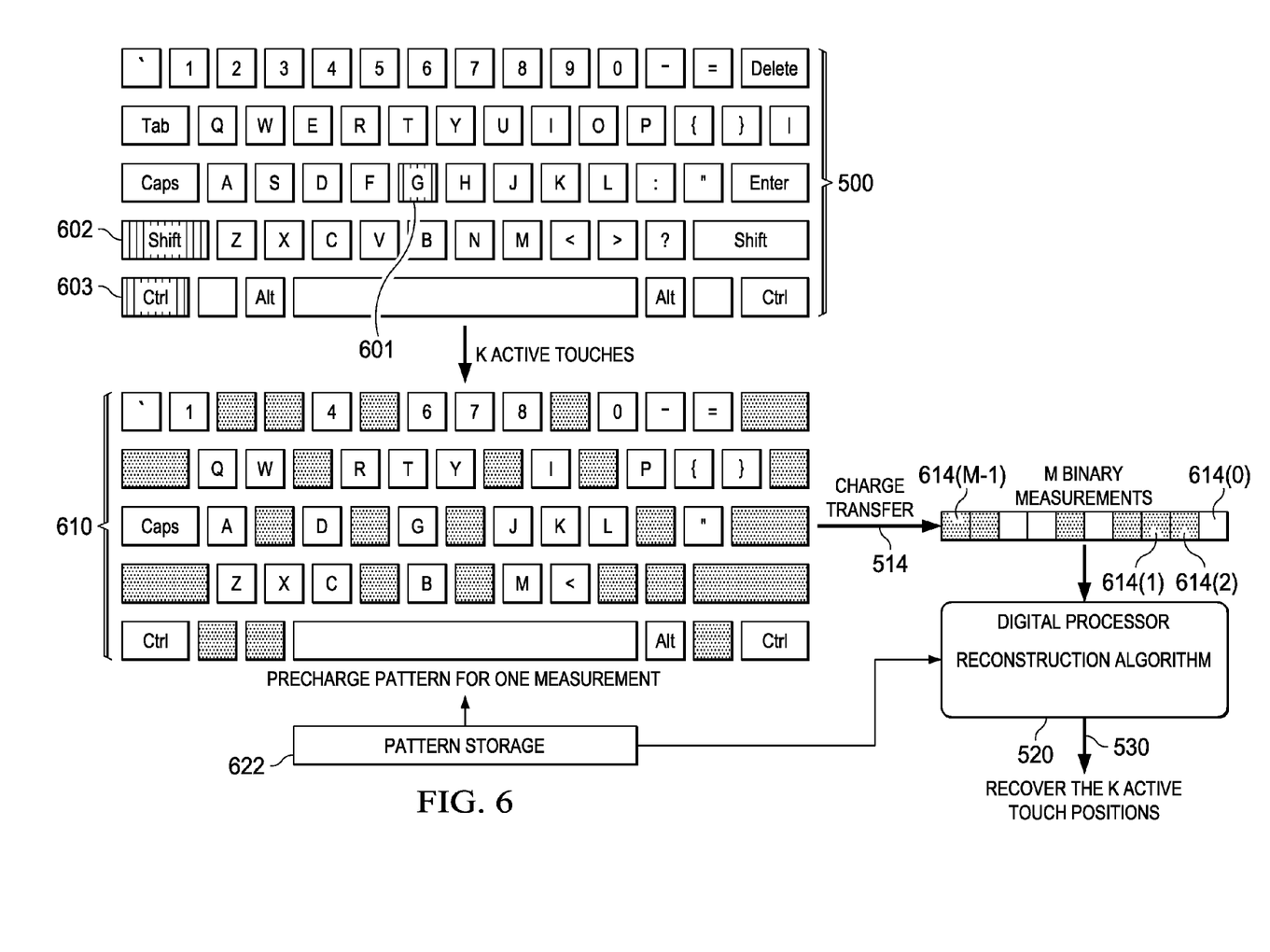
FIG. 6 illustrates a pre-charge, measurement and reconstruction process in more detail.

FIG. 6 illustrates a pre-charge, measurement, and reconstruction process for the keyboard of FIG. 5 in more detail. In this example, three keys are being touched, as indicated at 601, 602, and 603. In this example, one measurement cycle is being performed using a precharge pattern has indicated at 610. As described above, each measurement cycle is performed using a different precharge pattern that is formed using a pseudo-RNG. While each pattern may be a random pattern, each pattern is known and is stored in a data storage memory 622 that is accessible by processor 520 so that positional information associated with each pattern is available to the digital processor that is performing the reconstruction process to determine touch locations, as will be described in more detail below. After accumulating M 1-bit measurements results, a reconstruction algorithm may be executed by digital processor 520 to resolve the positions of the active touches 601-603.

A capacitance variation vector may be denoted as shown in (12). This vector includes one term for each of the N key positions in the keypad. For each key position, if the $\Delta C$ term is non-zero, that indicates a finger or other conductive stylus is in contact with the key position.

$$\Delta c = [\Delta C_0 \ldots \Delta C_{N-1}]^T \qquad (12)$$

A binary output vector from AFE 510, such as 614(0)-614(M-1) in FIG. 6, may be represented as shown by (13).

$$y = [y^0 \ldots y^{M-1}]^T \qquad (13)$$

Each Bernoulli distributed pre-charge matrix may be represented as shown in (14).

$$\Phi = \frac{-1}{C_{ref}} \begin{bmatrix} V_0^0 & \cdots & V_{N-1}^0 \\ \vdots & \ddots & \vdots \\ V_0^{M-1} & \cdots & V_{N-1}^{M-1} \end{bmatrix} \qquad (14)$$

In matrix form, (11) can be written as (15).

$$y = \text{sgn}(\Phi \Delta C) \qquad (15)$$

A process for resolving the position of the non-zero entries in $\Delta C$ (equation (12)) using the one-bit matrix y (equation (15)) will now be described.

Touch Location Reconstruction Algorithm

In general, the data acquisition model expressed in (15) is known; e.g., see P. T. Boufounos and R. G. Baraniuk, "1-bit compressive sensing," Information Sciences and Systems, 2008. CISS 2008. 42nd Annual Conference on, 2008, pp. 16-21, which is incorporated by reference herein. In this embodiment, however, $\Delta c$ is a sparse vector with only K (K<<N) non-zero values according to the sparse simultaneous touch assumption. The reconstruction of $\Delta c$ may be formulated as shown in (16).

$$\min \|x\|_1 \text{ such that. } y = \text{sgn}(\Phi x) \qquad (16)$$

Note that if $\hat{x}$ is an optimal solution in (16), then any positive scaling of $\hat{x}$ is also an optimal solution. In another words, the magnitude of the signal cannot be reconstructed with this embodiment of the sensing model. However, in this embodiment of the touch sensing model, the exact magnitude of $\Delta c$ is not important because only the non-zero positions of $\Delta c$ are of interest, which correspond to the touch locations. Therefore, an additional constraint $\|x\|_2=1$ is added to make (16) yield a unique solution and locate the non-zero positions in the optimal solution $\hat{x}x$. To get rid of the non-linear operator sgn, a diagonal matrix (17) may be defined.

$$Y = \text{diag}(y) \qquad (17)$$

Equation (16) may then be reformulated as (18).

$$\min \|x\|_1 \text{ such that } Y\Phi x \geq 0, y = \text{sgn}(\Phi x) \|x\|_2 = 1 \qquad (18)$$

Figure 7A:
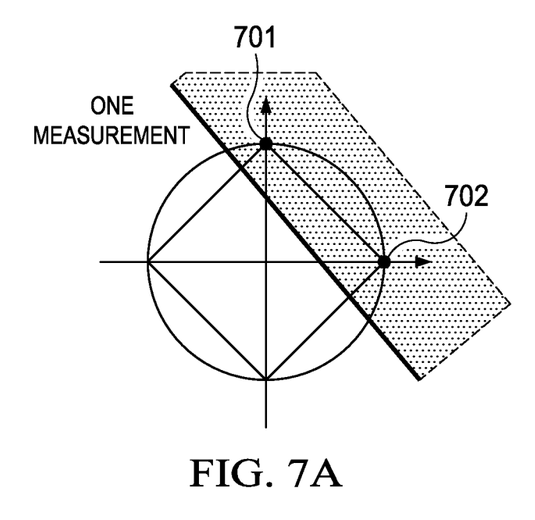
FIGS. 7A-7B illustrate a geometrical interpretation of a 1-bit compressing sensing scheme.
Figure 7B:
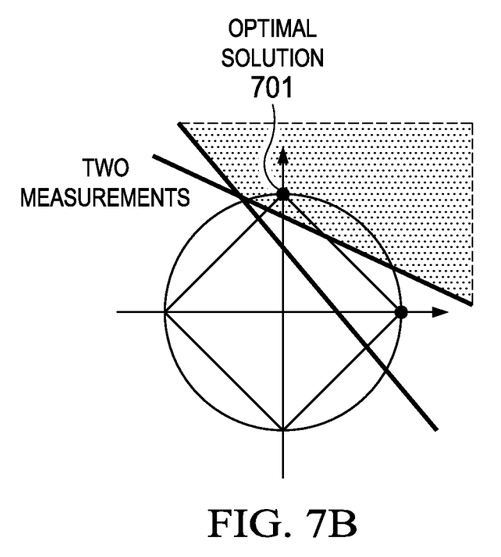

FIGS. 7A-7B illustrate a geometrical interpretation of a 1-bit compressing sensing scheme. Each binary measurement defines a hyperplane which confine the optimal solution in one of the two subspaces divided by the hyperplane. The hyperplane has a random orientation due to the randomized projection matrix $\phi$. As shown in FIG. 7A, with only one measurement, the optimal solution cannot be unambiguously determined. Due to the randomness of the hyperplane orientation, there is a high probability of confining the solution subspace so that there is only one optimal solution in the subspace once enough measurements have been obtained. As shown for the example case in FIG. 7B, the optimal solution may be determined with two measurements. A number of algorithms have been proposed to solve (18), such as matching sign pursuit, restricted-step shrinkage, and binary iterative hard thresholding (BIHT), for example. The BIHT algorithm may offer the best robustness for this application. The general concept of iterative hard thresholding (IHT) is well known, e.g. see T. Blumensath, M. Yaghoobi, and M. E. Davies, "Iterative hard thresholding and I0 regularisation," Acoustics, Speech and Signal Processing, 2007. ICASSP 2007. IEEE International Conference on, 2007, vol. 3, pp. 877-880, which is incorporated by reference herein. BIHT is a simple modification of IHT which solves the problem expressed by equation (19).

$$\min \|y - \Phi x\|_2 \text{ such that } \|x\|_0 = K \qquad (19)$$

The BIHT algorithm may be modified to monitor only the support of the solution in each iteration. In this example, the support of a function (supp(f)) is the set of points where the function is not zero-valued. A customized algorithm to determine the active support of $\Delta c$ is summarized in Table 1. Line 3 calculates the gradient expressed by expression (20) at $x^j$ and moves $x^j$ towards the direction of the gradient with a step size T.

$$\frac{1}{2} \Phi^T (y - \text{sgn}(\Phi x^j)) \qquad (20)$$

In line 4, the function $f_K(\ )$ keeps the K largest key position entries in terms of magnitude and zeros-out the rest of the key position entries. As indicated in line 6, the iteration stops when the support of $x^{j+1}$ remains the same as the previous iteration; in other words, when the non-zero locations of $x^{j+1}$ remain the same as the last iteration.

TABLE 1

A customized BIHT algorithm

Inputs: pre-charge matrix φ, binary measurement y, multi-touch support K, step size τ
Outputs: non-zero locations of Δc
  Initialization:
1  $x^0 = 0$
  Iteration
2  repeat
3  $z^{j+1} = x^j + \frac{\tau}{2}\Phi^T(y - \text{sgn}(\Phi x^j))$ 4  $x^{j+1} = f_K(z^{j+1})$
5  $j = j + 1$
6  Until supp($x^{j+1}$) == supp($x^j$)

Figure 8:
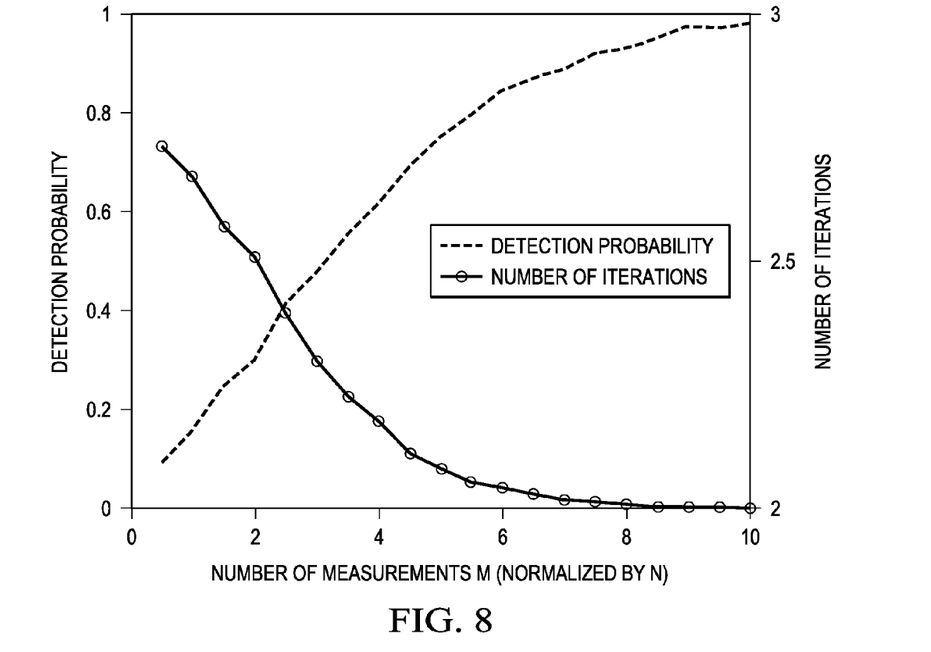
FIG. 8 shows a Monte Carlo simulation for the capacitance sensing model using a customized BIHT algorithm.

FIG. 8 shows a Monte Carlo simulation for the capacitance sensing model using the customized BIHT algorithm of Table 1. Every point on the figure is averaged over 1000 experiments. In this example, N is selected to be N=16*9=144 button touch pad with K=3 multi-touch support. The capacitance variation is assumed to be uniformly distributed in [0, 1] at K randomly picked locations. The number of measurements M may vary from 0.5N to 10N, for example.

The detection probability of the K multi-touches increases as more measurements are obtained, while the number of iterations for the disclosed algorithm to converge decreases. With more measurements, there will be a smaller solution subspace bounded by the measurement hyperplanes. Therefore, there is a higher probability of locating the optimal solution in the subspace and it takes the algorithm less iterations to converge to the optimal solution. On the other hand, more measurements require more power consumption and longer data acquisition time with the AFE and more computations in the digital reconstruction algorithm. Tradeoffs may be made between the AFE power consumption and acceptable detection probability by determining an optimal number of measurements for a particular system design, based on factors such as the number N of keys, the number K of assumed maximum number of simultaneous touches, system power budget, system digital processing resources, etc., for example.

Figure 9:
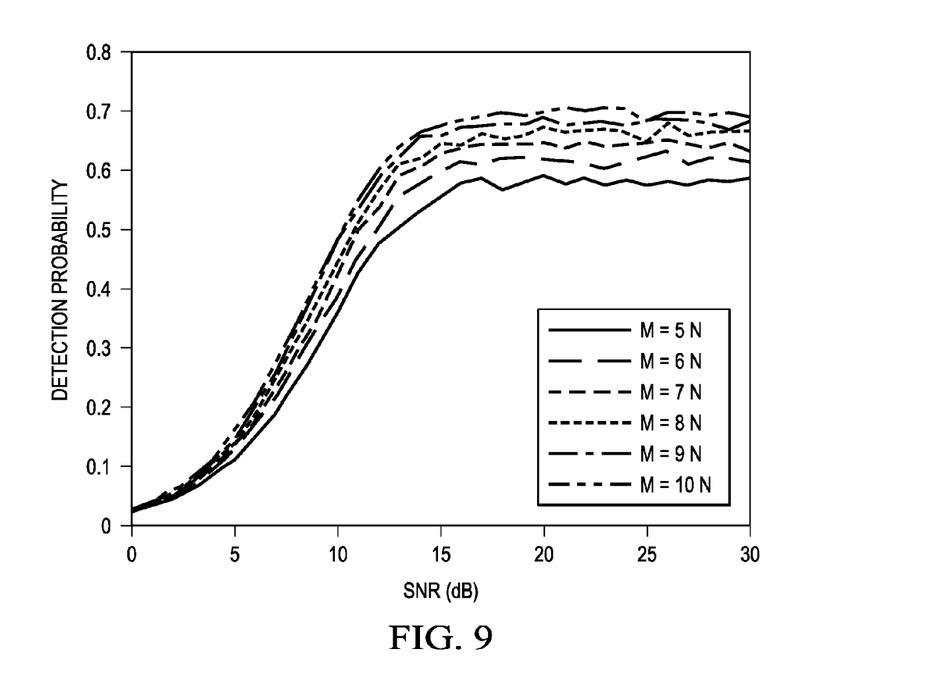
FIG. 9 shows a Monte Carlo simulation with variable SNRs.

FIG. 9 shows a Monte Carlo simulation with variable signal to noise ratios (SNRs). The detection probability increases as more measurements are taken and/or the measurements have a higher SNR.

A novel architecture for the design of an ultra low power self-capacitive touch sensing analog front end has been disclosed herein that exploits the sparsity of simultaneous touches with respect to the number of sensor nodes. The disclosed AFE is significantly simplified compared with the standard AFE design which requires one or multi-channel ADCs. The number of measurements required in order to resolve the touch positions is related to the number of simultaneous touches rather than the number of sensor nodes. The touch positions may be resolved by a recovery algorithm in the digital domain, as disclosed herein.

Figure 10:
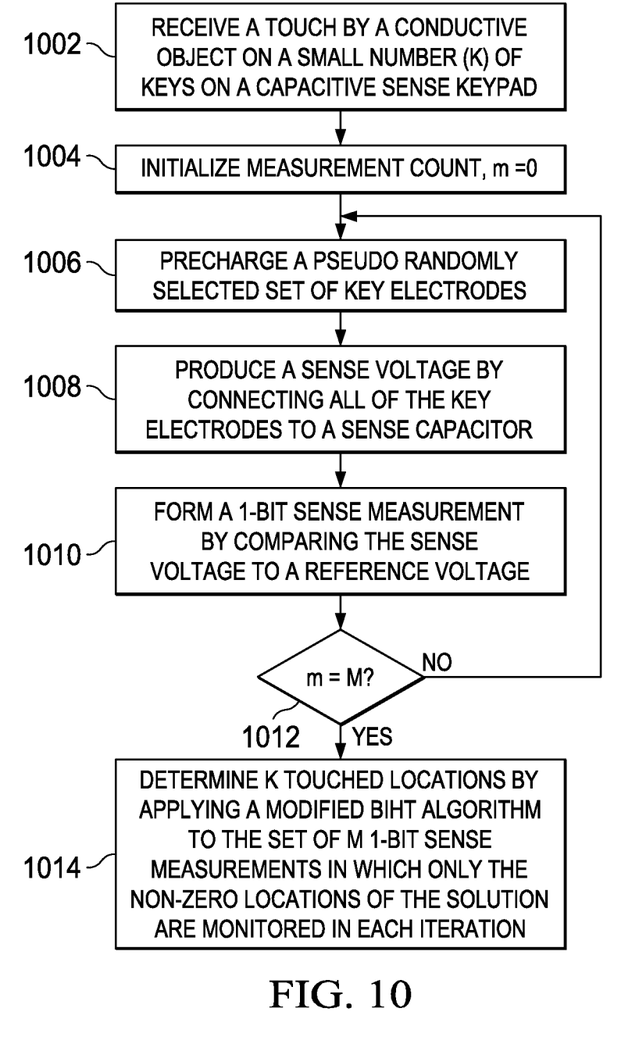
FIG. 10 illustrates a flow diagram of the operation of a 1-bit capacitive touch sensing AFE.

FIG. 10 illustrates a flow diagram of the operation of a keypad that uses a 1-bit capacitive touch sensing AFE as described above. As described above in more detail, a keypad such as keyboard 500 may have N keys that each have a separate capacitive key electrode, such as electrode 112. At any one time, one or more of the keys may receive 1002 a touch by a conductive object, such as a finger or stylus, for example. However, at any one time, the number K of keys that are touched is much less than N.

In order to determine which keys are being touched, an iterative measurement phase is performed in which each measurement iteration produces only a single one-bit result. During a measurement phase, a count index is initialized 1004. For each iteration, a randomly selected set of key electrodes is precharged 1006 while the rest of the key electrodes are discharged while the keyboard is being touched. As mentioned above, a representation of each random set is stored for use during the touch location reconstruction phase. The random sets may be generated on the fly in some embodiments. In another embodiment, the random sets may be produced during a setup phase and then stored in a data array storage module, such as 622, coupled to digital processing logic, such as 520, for the keyboard, for example. The setup phase may be done during manufacture of the keyboard, for example. In another embodiment, the random set data may be downloaded into a storage location coupled to digital processing logic for the keyboard, for example.

After a pattern of key electrodes is precharged, a sense voltage is produced 1008 for each iteration by coupling all of the key electrodes to a reference capacitor, as described with regard to equation (8), for example.

A 1-bit sense measurement is formed 1010 for each iteration by comparing the sense voltage to a reference voltage, in which the reference voltage may be determined during a calibration phase as described above with regard to equation (9), for example.

The sequence of precharging, sensing, and comparing is repeated 1012 for M iterations to form a set of M 1-bit sense measurements.

The location of each of the K touched keys is then determined during a reconstruction phase by applying a modified binary iterative hard threshold (BIHT) algorithm to the set of M 1-bit sense measurements in which only the non zero locations of the solution are monitored in each iteration, as described above in more detail with regard to Table 1, for example.

System Example

Figure 11:
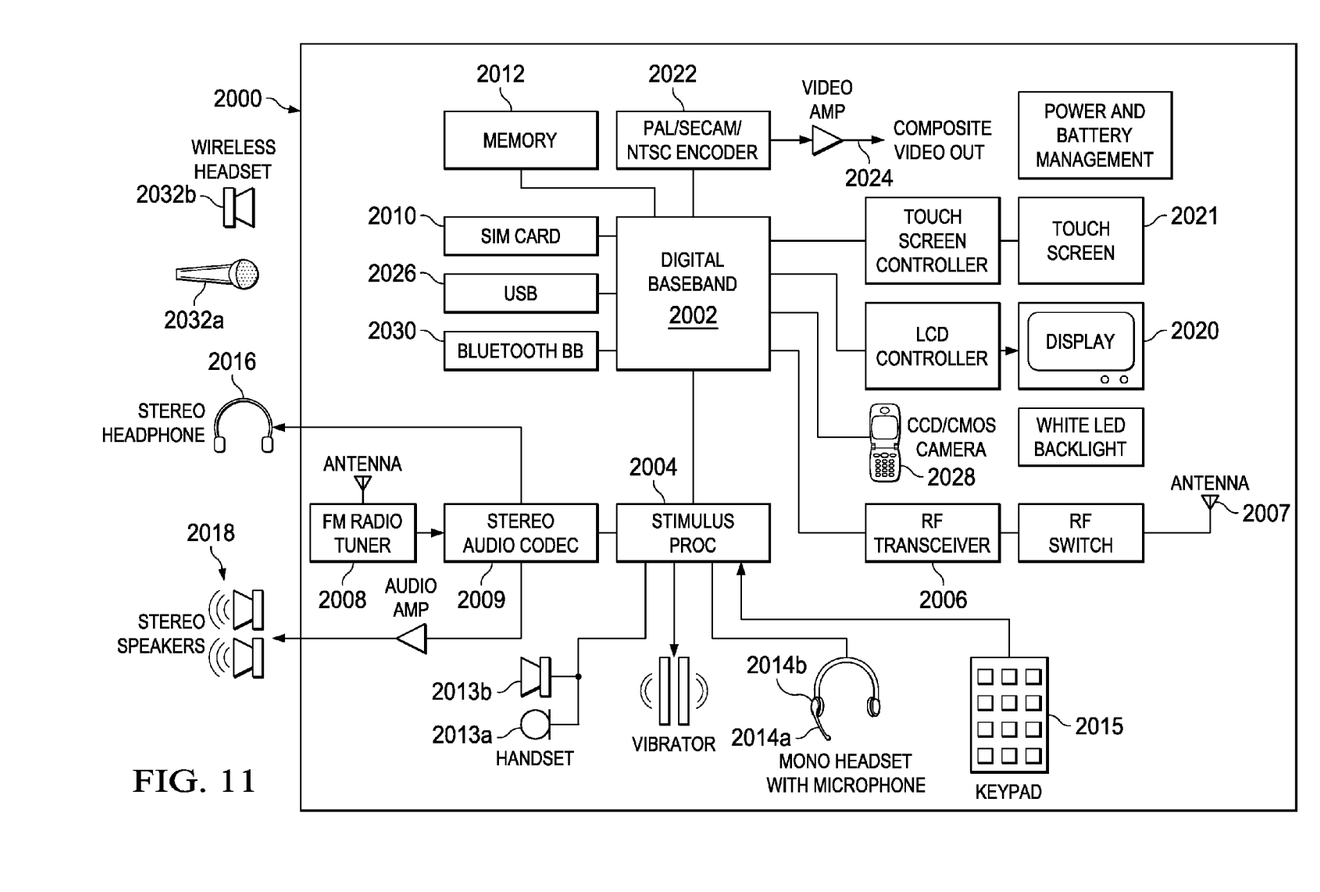
FIG. 11 illustrates a system that includes a capacitive touch sensing keypad.

FIG. 11 is a block diagram of an exemplary mobile cellular smart phone 2000 that includes an embodiment of the present disclosure. The general design and operation of smart phones are well known and need not be described in detail herein. In brief, digital baseband (DBB) unit 2002 may include a digital processing processor system (DSP) that includes embedded memory and security features. Stimulus Processing (SP) unit 2004 receives a voice data stream from handset microphone 2013a and sends a voice data stream to handset mono speaker 2013b. SP unit 2004 also receives a voice data stream from microphone 2014a and sends a voice data stream to mono headset 2014b. SP and DBB may be separate ICs, or may be combined into a single IC. In most embodiments, SP does not embed a programmable processor core, but performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

RF transceiver 2006 is a digital radio processor and includes a receiver for receiving a stream of coded data frames from a cellular base station via antenna 2007 and a transmitter for transmitting a stream of coded data frames to the cellular base station via antenna 2007. RF transceiver 2006 is coupled to DBB 2002 which provides processing of the frames of encoded data being received and transmitted by cell phone 2000.

DBB unit 2002 may send or receive data to various devices connected to universal serial bus (USB) port 2026. DBB 2002 can be connected to subscriber identity module (SIM) card 2010 and stores and retrieves information used for making calls via the cellular system. DBB 2002 can also be connected to memory 2012 that augments the onboard memory and is used for various processing needs. DBB 2002 can be connected to Bluetooth baseband unit 2030 for wireless connection to a microphone 2032a and headset 2032b for sending and receiving voice data. DBB 2002 may also be connected to display 2020 and can send information to it for interaction with a user of the mobile UE 2000 during a call process.

Keypad 2015 may be implemented as a standalone capacitive sense keypad as described in more detail above, or it may be implemented as part of touch screen 2021, for example. Touch screen 2021 may be connected to DBB 2002 for haptic feedback using capacitive touch sensing as described in more detail above. Processor 2002 may perform the key reconstruction algorithm described herein. Touch screen 2021 may be implemented as an overlay on display screen 2020 using known techniques to form transparent capacitive electrodes, for example.

Display 2020 may also display pictures received from the network, from a local camera 2028, or from other sources such as USB 2026. DBB 2002 may also send a video stream to display 2020 that is received from various sources such as the cellular network via RF transceiver 2006 or camera 2028. DBB 2002 may also send a video stream to an external video display unit via encoder 2022 over composite output terminal 2024. Encoder unit 2022 can provide encoding according to PAL/SECAM/NTSC video standards. In some embodiments, audio codec 2009 receives an audio stream from FM Radio tuner 2008 and sends an audio stream to stereo headset 2016 and/or stereo speakers 2018. In other embodiments, there may be other sources of an audio stream, such a compact disc (CD) player, a solid state memory module, etc.

OTHER EMBODIMENTS

While the disclosure has been described with reference to illustrative embodiments, this description is not intended to be construed in a limiting sense. Various other embodiments of the disclosure will be apparent to persons skilled in the art upon reference to this description. For example, a capacitive sense keypad may have only one or just a few key electrodes in some embodiments, while a full-up keyboard may be implemented in other embodiments. In each embodiment, simple 1-bit capacitive sensing may be used to sense touches to the one or more key electrodes by a person's finger or by other types of conductive stylus. Of course, in the case if a single key keypad, location reconstruction is not required.

While a cellular smart phone system that employs a capacitive touch sensing keypad was described herein, embodiments of the disclosure may be used with all manner of systems in which a keypad may be used to provide tactile input into a system, such as: tablet computers, laptop computers, digital assistant devices, automotive user interfaces, appliance user interfaces, televisions, industrial control panels, etc., for example.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP), or systems on a chip (SoC) such as combinations of a DSP and a reduced instruction set (RISC) processor together with various specialized accelerators, for example. A stored program in an onboard or external (flash EEP) ROM or FRAM (ferric random access memory) may be used to implement aspects of the touch location reconstruction algorithm processing. The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., optical disk, flash memory, USB key, etc.), via a transmission path from computer readable media on another digital system, etc, for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A method for operating a capacitive touch keypad, the method comprising:
    receiving a touch by a conductive object to one or more keys of the keypad, in which the keypad has a plurality of keys that each have a separate capacitive key electrode;
    precharging a pseudo-randomly selected set of key electrodes a number (M) of iterations while the keyboard is being touched;
    producing a sense voltage for each iteration by coupling all of the key electrodes to a reference capacitor;
    producing a 1-bit sense measurement for each iteration by comparing the sense voltage to a reference voltage to form a set of M 1-bit sense measurements; and determining each touched key location by applying a modified binary iterative hard threshold (BIHT) algorithm to the set of M 1-bit sense measurements, in which only the non-zero locations of the solution are monitored in each iteration.

2. The method of claim 1, in which the keyboard has a number N of keys, and in which no more than a number K of keys is touched simultaneously, in which K<<N.

3. The method of claim 2, in which the number of measurements M is in the range of 0.5N to 10N.

4. The method of claim 1, in which each randomly selected set of key electrodes is selected using a Bernoulli random number generator with a selection probability of approximately 0.5.

5. The method of claim 1, in which a matrix $\Phi$ representation of each of the M pseudo-randomly selected set of key electrodes is stored for use by the modified BIHT algorithm.

6. The method of claim 2, in which each iteration of the modified BIHT algorithm retains a set of key positions X corresponding to the K largest entries in terms of magnitude and zeros out the rest of the key position entries.

7. The method of claim 6, in which the modified BIHT algorithm iterates until the support of X remains the same as the previous iteration, in which case the non-zero locations of X remain the same as the previous iteration.

8. A system comprising:
a capacitive touch keypad having a plurality of keys in which each key has a separate capacitive key electrode;
a precharge source and a reference source;
a set of precharge switches coupled between the precharge source and the plurality of key electrodes;
a set of sense switches coupled between the plurality of key electrodes and a single sense capacitor; and
a 1-bit comparator having one input coupled to the reference source and a second input coupled to a voltage signal responsive to the sense capacitor, the 1-bit comparator having a 1-bit binary sense output.

9. The system of claim 8, including control logic coupled to a data memory configured to store a set of precharge patterns and controllably coupled to the set of precharge switches and controllably coupled to the set of sense switches.

10. The system of claim 9, in which the control logic is operable to:
control the set of precharge switches to precharge a pseudo-randomly selected set of key electrodes a number (M) of iterations while the keyboard is being touched by a conductive object; and
control the set of sense switches to couple all of the key electrodes to the single sense capacitor, such that the binary sense output provides a 1-bit sense measurement.

11. The system of claim 10 including:
a digital processor coupled to a memory configured to store instructions, in which the digital processor is coupled to receive the binary sense output, and in which the digital processor is coupled to access the data memory.

12. The system of claim 11, in which the digital processor is operable to execute instructions stored in the memory to determine each touched key location by:
causing the control logic to precharge a pseudo-randomly selected set of key electrodes a number (M) of iterations while the keyboard is being touched to produce a set of M 1-bit sense measurements; and
applying a modified binary iterative hard threshold (BIHT) algorithm to the set of M 1-bit sense measurements, in which only the non-zero locations of the solution are monitored in each iteration.

13. The system of claim 8 being a cellular smart phone, in which the capacitive touch keypad is overlaid on a display screen.

14. A non-transitory computer readable medium storing software instructions that, when executed periodically by a processor of a system with a capacitive sense keypad, cause a method for determining touched keys to be performed, the method comprising:
precharging a pseudo-randomly selected set of key electrodes a number (M) of iterations while the keypad is being touched;
producing a sense voltage for each iteration by coupling all of the key electrodes to a reference capacitor;
producing a 1-bit sense measurement for each iteration by comparing the sense voltage to a reference voltage to form a set of M 1-bit sense measurements; and
determining each touched key location by applying a modified binary iterative hard threshold (BIHT) algorithm to the set of M 1-bit sense measurements, in which only the non-zero locations of the solution are monitored in each iteration.

15. The method of claim 14, in which the keypad has a number N of keys, and in which no more than a number K of keys is touched simultaneously, in which K<<N.

16. The method of claim 15, in which the number of measurements M is in the range of 0.5N to 10N.

17. The method of claim 14, in which each randomly selected set of key electrodes is selected using a Bernoulli random number generator with a selection probability of approximately 0.5.

18. The method of claim 14, in which a matrix $\Phi$ representation of each of the M pseudo-randomly selected set of key electrodes is stored for use by the modified BIHT algorithm.

19. The method of claim 15, in which each iteration of the modified BIHT algorithm retains a set of key positions X corresponding to the K largest entries in terms of magnitude and zeros out the rest of the key position entries.

20. The method of claim 19, in which the modified BIHT algorithm iterates until the support of X remains the same as the previous iteration, in which case the non-zero locations of X remain the same as the previous iteration.

* * * * *